(12) United States Patent
Deng et al.

(10) Patent No.: US 11,342,359 B2
(45) Date of Patent: May 24, 2022

(54) DISPLAY PANEL AND ELECTRONIC DEVICE

(71) Applicant: SHENZHEN CHINA STAR OPTOELECTRONICS SEMICONDUCTOR DISPLAY TECHNOLOGY CO., LTD., Shenzhen (CN)

(72) Inventors: Fan Deng, Guangdong (CN); Xiaohui Yao, Guangdong (CN); Ilgon Kim, Guangdong (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 59 days.

(21) Appl. No.: 16/771,014

(22) PCT Filed: May 15, 2020

(86) PCT No.: PCT/CN2020/090599
§ 371 (c)(1),
(2) Date: Jun. 9, 2020

(87) PCT Pub. No.: WO2021/217741
PCT Pub. Date: Nov. 4, 2021

(65) Prior Publication Data
US 2021/0343749 A1 Nov. 4, 2021

(30) Foreign Application Priority Data

Apr. 29, 2020 (CN) .......................... 202010354578.2

(51) Int. Cl.
*G02F 1/1362* (2006.01)
*H01L 27/12* (2006.01)
(Continued)

(52) U.S. Cl.
CPC ...... *H01L 27/124* (2013.01); *G02F 1/134336* (2013.01); *G02F 1/136222* (2021.01);
(Continued)

(58) Field of Classification Search
CPC ............. H01L 27/124; G02F 1/134336; G02F 1/136286; G02F 1/136222
See application file for complete search history.

(56) References Cited

FOREIGN PATENT DOCUMENTS

| CN | 108196408 A | 6/2018 |
|---|---|---|
| CN | 110147002 A | 8/2019 |
| CN | 110716359 A | 1/2020 |

OTHER PUBLICATIONS

CN 110716359 A translation (Year: 2020).*

* cited by examiner

*Primary Examiner* — James A Dudek
(74) *Attorney, Agent, or Firm* — The Roy Gross Law Firm, LLC; Roy Gross

(57) ABSTRACT

The present application proposes a display panel, including a display area and a non-display area surrounding the display area, wherein the display panel includes: a plurality of metal traces and a plurality of color resist blocks located in the display area; and a test key located in the non-display area, wherein the test key includes a plurality of color resist patterns and a plurality of metal patterns, each of the color resist patterns corresponds to a corresponding one of the color resist blocks, each of the metal patterns corresponds to one of the metal traces, and each of the color resist patterns is disposed correspondingly between adjacent ones of the metal patterns.

16 Claims, 10 Drawing Sheets

(51) Int. Cl.
*G02F 1/1343* (2006.01)
*H01L 21/66* (2006.01)

(52) U.S. Cl.
CPC .... *G02F 1/136286* (2013.01); *H01L 27/1248* (2013.01); *G02F 1/136254* (2021.01); *H01L 22/12* (2013.01)

DISPLAY PANEL AND ELECTRONIC DEVICE

BACKGROUND OF INVENTION

Field of Invention

The present application relates to a technical field of display panels, and in particular to a test key design of a display panel and an electronic device including the display panel.

Description of Prior Art

In the field of display technology today, liquid crystal displays (LCDs) have been widely used in daily life, such as mobile phones or televisions. An LCD display panel is mainly composed of a thin film transistor (TFT) array substrate, a color filter (CF) substrate, and a liquid crystal layer disposed between the two substrates. With the improvement of display technology, color filter on array (COA) technology has been developed, which is to make a color resist block on a thin film transistor array substrate. The color resist block includes a red color resist block, a green color resist block, and a blue color resist block. As shown in FIG. 1(a), a plurality of display panels 2 are prepared on a mother board 1, and the main monitoring mark (test key) 3 is set at four corners of the mother board 1. As shown in FIG. 1(b), a display area of each of the display panels 2 is provided with a plurality of color resist blocks 601, wherein the color resist blocks 601 include a red color resist block, a green color resist block, and a blue color resist block. Metal traces 501 (such as column driving lines) are adjacent to and disposed between the red color resist block, the green color resist block, and the blue color resist block, as shown in FIG. 1(c), widths of the red color resist block, the green color resist block, and the blue color resist block may vary during the actual manufacturing process, and shifting and overlapping may occur between the color resist blocks 601 and the metal trace 501. When the shifting/overlapping width is too large or too small, the performance such as flatness and shielding will be deteriorated.

Although the main monitoring mark is set to monitor the widths of the color resist blocks, and the shifting and overlapping between the color resist blocks and the column driving lines, the main monitor mark is often defective in the actual production, which leads to monitoring failure. In addition, the main monitoring mark cannot monitor every single one of the display panels, and the monitoring accuracy needs to be improved. Therefore, there is a need to provide a test key suitable for setting on each of the display panels and set it on each of the display panels to monitor the shifting and overlapping of the color resist blocks in each of the display panels.

SUMMARY OF INVENTION

Embodiments of the present application provide a display panel and an electronic device, wherein a test key is provided in each display panel to solve the problem that relative positions of metal traces, widths of color resist blocks, and shifting/overlapping width of the color resist blocks relative to the metal traces in a display area of the display panel cannot be monitored due to failure of the main monitoring mark in the manufacture of the existing display panel, and improve the monitoring accuracy of each display panel.

A display panel includes a display panel, including a display area and a non-display area surrounding the display area, wherein the display panel includes: a plurality of metal traces and a plurality of color resist blocks located in the display area; and a test key located in the non-display area, wherein the test key includes a plurality of color resist patterns and a plurality of metal patterns, each of the color resist patterns corresponds to one of the color resist blocks of a color same as its corresponding one of the color resist patterns, each of the metal patterns corresponds to one of the metal traces, and each of the color resist patterns is disposed correspondingly between adjacent ones of the metal patterns.

The present application also proposes an electronic device including a display panel, the display panel including a display area and a non-display area surrounding the display area, wherein the display panel includes: a plurality of metal traces and a plurality of color resist blocks located in the display area; and a test key located in the non-display area, wherein the test key includes a plurality of color resist patterns and a plurality of metal patterns, each of the color resist patterns corresponds to one of the color resist blocks of a color same as its corresponding one of the color resist patterns, each of the metal patterns corresponds to one of the metal traces, and each of the color resist patterns is disposed correspondingly between adjacent ones of the metal patterns.

Beneficial effects of the present application are as follows: a test key is set in the non-display area of each display panel, wherein relative positions of metal traces, widths of color resist blocks, and shifting/overlapping degree of the color resist blocks relative to the correspondingly adjacent ones of the metal patterns in the test key is used to monitor the widths of color resist blocks, and shifting/overlapping degree of the color resist blocks relative to the adjacent ones of the metal traces in a display area of the display panel, such that the failure to monitor can be avoided when the main monitoring mark fails, thereby improving the monitoring accuracy of each display panel.

BRIEF DESCRIPTION OF DRAWINGS

FIG. 12(*b*) is a schematic structural diagram of a test key of a display panel according to Embodiment 8 of the present application.

FIG. 12(*c*) is a schematic structural diagram of a test key of a display panel according to Embodiment 8 of the present application.

FIG. 12(*d*) is a schematic structural diagram of a test key of a display panel according to Embodiment 8 of the present application.

DETAILED DESCRIPTION OF PREFERRED EMBODIMENTS

Figure 1:
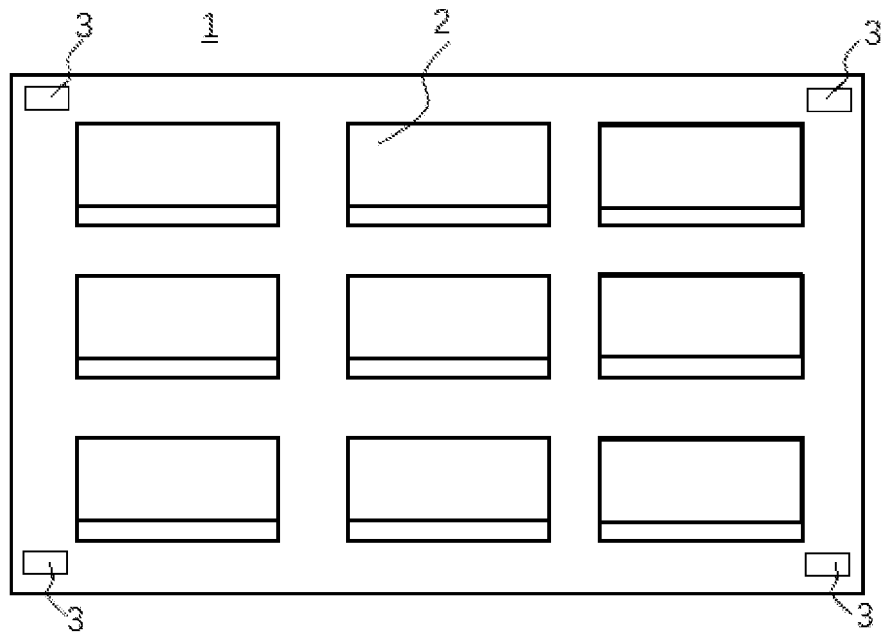
FIG. 1(a) is a schematic diagram of a main monitoring mark in the mother board according to the prior art.
FIG. 1(b) is a schematic diagram of a color resist blocks in a display area of a display panel according to the prior art.
FIG. 1(c) is a schematic diagram of a color resist blocks in a display area of a display panel according to the prior art.
Figure 1:
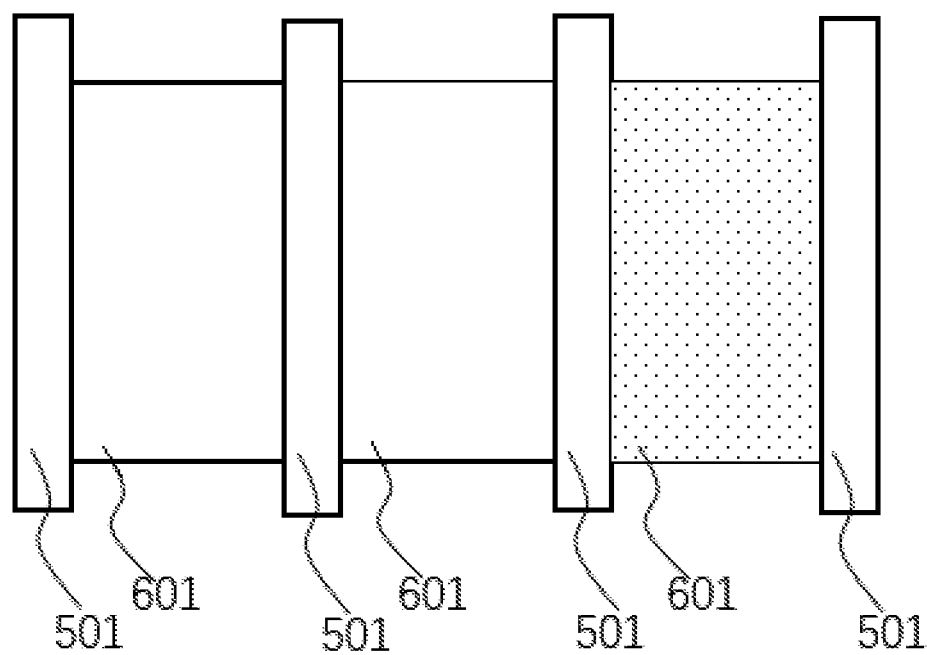
Figure 1:
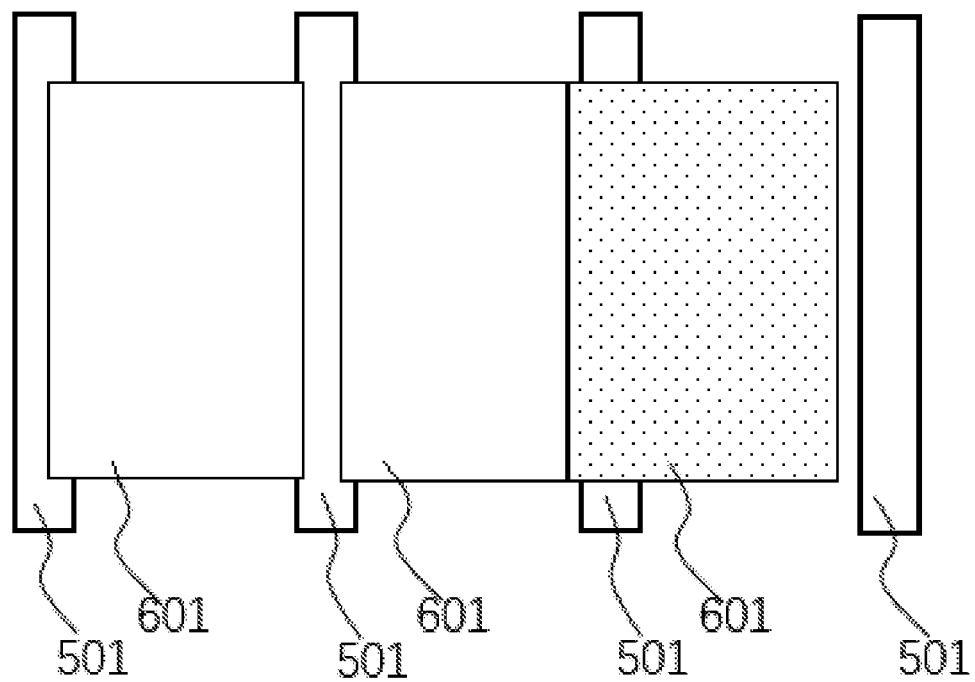

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application.

In the description of this application, it should be understood that the terms "center", "longitudinal", "transverse", "length", "width", "thickness", "upper", "lower", "front", "Rear", "left", "right", "vertical", "horizontal", "top", "bottom", "inside", "outside", "clockwise", "counterclockwise", and the like are based on the orientation or positional relationship shown in the drawings, and is merely for the convenience of describing the present invention and simplifying the description, rather than indicating or implying that the device or element referred to must have a specific orientation, structure and operation in a specific orientation, which should not be construed as limitations on the present invention. In addition, the terms "first" and "second" are used for descriptive purposes only, and cannot be understood as indicating or implying relative importance or implicitly indicating the number of technical features indicated. Therefore, the features defined as "first" and "second" may explicitly or implicitly include one or more of the features. In the description of the present application, the meaning of "a plurality" is two or more, unless specifically defined otherwise.

In the description of this application, it should be noted that the terms "installation", "connected", and "connected" should be understood in a broad sense unless explicitly stated and limited otherwise. For example, it can be a fixed connection, a detachable connection, or an integral connection; it can also be a mechanical connection or an electrical connection; it can be a direct connection; or it can be an indirect connection through an intermediate medium; or it can be a communication between two components.

In the present invention, unless otherwise expressly stated and limited, the formation of a first feature over or under a second feature in the description that follows may include embodiments in which the first and second features are formed in direct contact, and may also include embodiments in which additional features may be formed between the first and second features, such that the first and second features may not be in direct contact. Moreover, the first feature "above", "over" and "on" the second feature includes the first feature directly above and above the second feature, or merely indicating that the first feature is at a level higher than the second feature. The first feature "below", "under" and "beneath" the second feature includes the first feature directly below and obliquely below the second feature, or merely the first feature has a level lower than the second feature.

The following disclosure provides many different embodiments or examples for implementing different structures of the present invention. In order to simplify the disclosure of the present invention, the components and arrangements of the specific examples are described below. Of course, they are merely examples and are not intended to limit the present invention. In addition, the present invention may repeat reference numerals and/or reference letters in the various embodiments, which are for the purpose of simplicity and clarity, and do not indicate the relationship between the various embodiments and/or arrangements discussed. Moreover, the present invention provides examples of various specific processes and materials, but one of ordinary skill in the art will recognize the use of other processes and/or the use of other materials.

An embodiment of the present application provides a display panel including a display area and a non-display area surrounding the display area. The display panel includes: a plurality of metal traces and a plurality of color resist blocks located in the display area; and a test key located in the non-display area, wherein the test key includes a plurality of color resist patterns and a plurality of metal patterns, each of the color resist patterns corresponds to one of the color resist blocks of a color same as its corresponding one of the color resist patterns, each of the metal patterns corresponds to one of the metal traces, and each of the color resist patterns is disposed correspondingly between adjacent ones of the metal patterns.

Beneficial effects of the present application are as follows: a test key is set in the non-display area of each display panel, wherein relative positions of metal traces, widths of color resist blocks, and shifting/overlapping degree of the color resist blocks relative to the correspondingly adjacent ones of the metal patterns in the test key is used to monitor the widths of color resist blocks, and shifting/overlapping degree of the color resist blocks relative to the adjacent ones of the metal traces in a display area of the display panel, such that the failure to monitor can be avoided when the main monitoring mark fails, thereby improving the monitoring accuracy of each display panel.

The present application will be further described below with reference to the drawings and embodiments.

Embodiment 1

Figure 2:
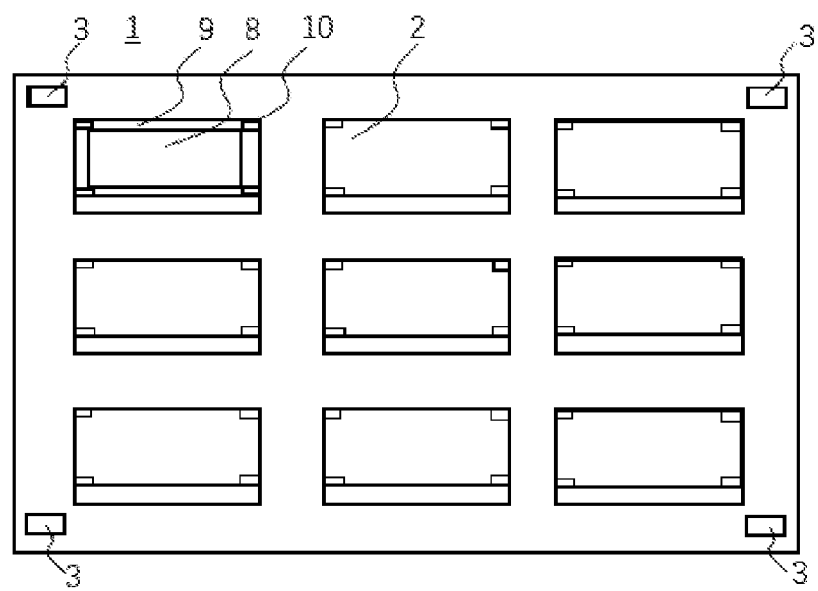
FIG. 2 is a schematic structural diagram of a display mother board according to Embodiment 1 of the present application.
Figure 3:
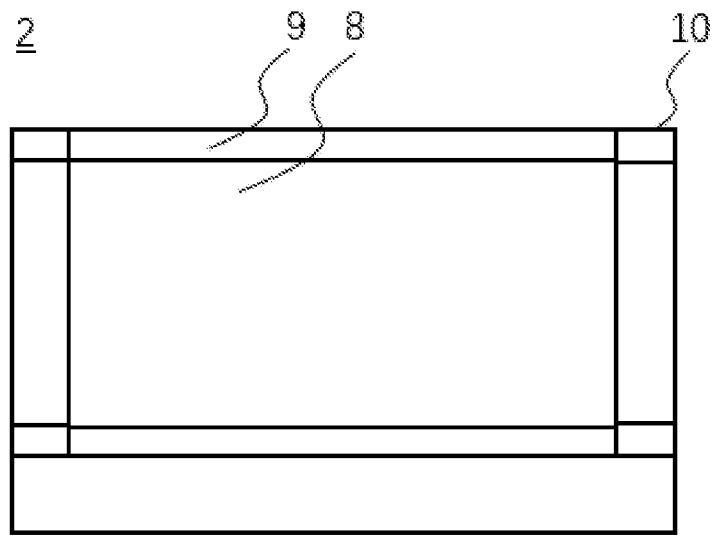
FIG. 3 is a schematic structural diagram of a display panel according to Embodiment 1 of the present application.
Figure 4:
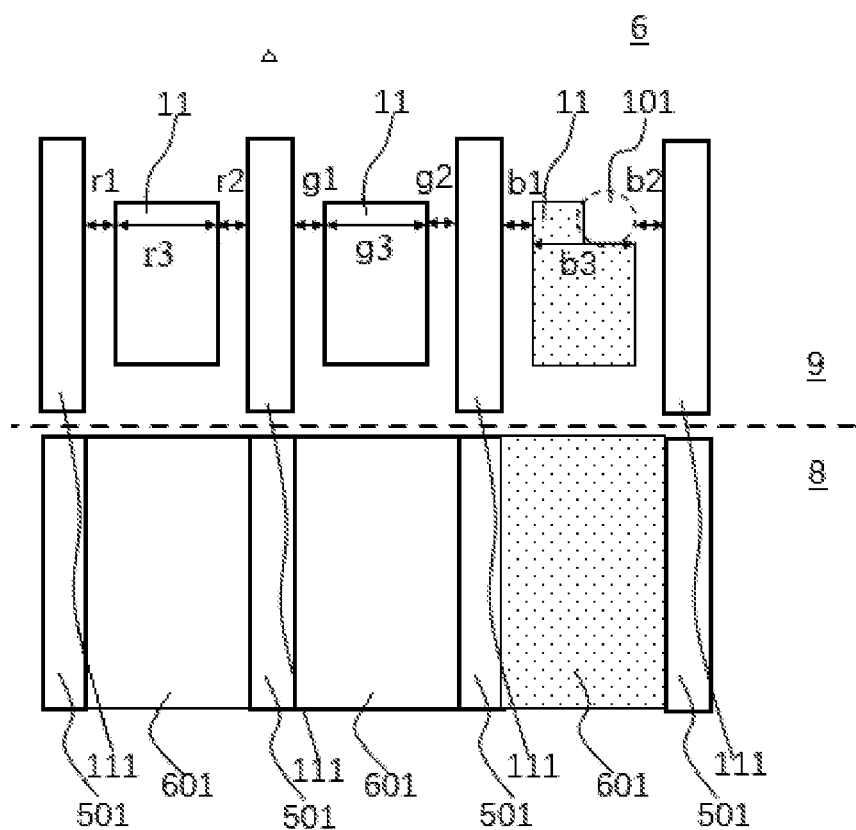
FIG. 4 is a schematic structural diagram of a test key of a display panel according to Embodiments 1 and 2 of the present application.

Referring to FIG. 2 and FIG. 3 in conjunction with a test key in FIG. 4 as an example for illustration, the embodiment of the present application provides a display panel. The display panel 2 includes a display area 8 and a non-display area 9 surrounding the display area 8. The display area 8 is provided with a plurality of metal traces 501 and a plurality of color resist blocks 601. A test key 10 is located in the non-display area 9. The test key 10 includes a plurality of color resist patterns 11 and a plurality of metal patterns 111, each of the color resist patterns 11 corresponds to one of the color resist blocks 601 of a color same as its corresponding one of the color resist patterns 11, each of the metal patterns 111 corresponds to one of the metal traces 501, and each of the color resist patterns 11 is disposed correspondingly between adjacent ones of the metal patterns 111.

Specifically, the display area 8 of the display panel 2 is provided with a plurality of color resist blocks 601, and the color resist blocks include a red color resist block R, a green color resist block G, and a blue color resist block B. The test key 10 includes a plurality of color resist patterns 11, the color resist patterns include a red color resist pattern R, a green color resist pattern G, and a blue color resist pattern B, and each of the color resist patterns corresponds to a corresponding one of the color resist blocks, that is, the red color resist pattern R corresponds to the red color resist block R, the green color resist pattern G corresponds to the green color resist block G, and the blue color resist pattern B corresponds to the blue color resist block B. The red color resist pattern R and the red color resist block R are formed of the same material and by the same process, the green color resist pattern G and the green color resist block G are formed of the same material and by the same process, and the blue color resist pattern B and the blue color resist block B are formed of the same material and by the same process. The display area 8 of the display panel 2 is provided with a plurality of metal traces 501, wherein each of the metal patterns 111 of the test key 10 corresponds to a corresponding metal trace 501, that is, each of the metal patterns 111 and its corresponding metal trace 501 are formed of the same material and by the same process, for example, both which are formed by the same process of the column driving line, and especially when the metal traces are data lines, part or all of the plurality of metal patterns 111 and the data lines are formed of the same material and by the same process.

Referring to FIG. 2, a plurality of the display panels 2 are formed in the display mother board 1, and the mother board 1 is provided with a plurality of main monitoring marks 3 in a dummy area. Although the main monitoring marks 3 are set to monitor shifting and overlapping between each of the color resist layers and column driving lines/row driving lines, in actual production, the main monitoring marks 3 are often defective, which leads to monitoring failure, such that the main monitoring marks 3 cannot monitor each display panel 2, and the monitoring accuracy needs to be improved. In addition, there is a problem of uniformity of film formation in the manufacturing process of the color resist blocks and the metal traces, that is, the closer the color block, and the metal traces, the better the size uniformity. By setting the test key 10 in each display panel, the shapes and sizes of the plurality of color resist patterns in the test key 10 can be better kept consistent with the plurality of color resist blocks in the display area, and the shapes and sizes of a plurality of metal patterns in test key 10 can be better kept consistent with the metal traces in the display area, so as to accurately monitor the pattern layer in the display area through the test key 10.

In a preferred embodiment and implementation of this embodiment, the test key is provided at a portion of the non-display area 9 adjacent to the display area 8. The test key 10 is arranged in the non-display area 9 closely adjacent to the display area 8, to reduce the space and area occupied by the test key 10 in the non-display area, which facilitates the layout and manufacturing of the test key 10 in the display panel 2. Meanwhile, the test key 10 is disposed closely adjacent to the display area 8. Considering the uniformity of the pattern layer formation, the shapes and sizes of a plurality of color resist patterns and a plurality of metal patterns in the test key 10 can be better kept consistent with the display area, so as to accurately monitor the pattern layer in the display area through the test key 10.

As an improvement, the color resist pattern is provided with skirt-shaped portions on one side in the first direction and/or the second direction, and a distance from a side of a bottom surface of each of the skirt-shaped portions close to the color resist pattern to another side of the bottom surface of each of the skirt-shaped portions away from the color resist pattern is consistent. A side surface of the skirt-shaped portions away from the color resist pattern is an inclined surface. An area of the bottom surface of the skirt-shaped portions is larger than the area of a top surface of the skirt-shaped portions. A convex strip or a groove is provided on the inclined surface, and the convex strip or the groove has a wavy shape or a zigzag shape. The convex strip or the groove extends from the bottom surface of the skirt-shaped portions to the top surface of the skirt-shaped portions. A distance between any two peaks of the wavy or zigzag convex strip or the groove is consistent, or a distance between any two tips of the zigzag shape is the same. The wavy or zigzag convex strip or groove is used to mark a thickness of the color resist pattern, that is, when a charge coupled device (CCD) photographs the color resist pattern in a direction perpendicular to the display panel, the captured image includes the wavy or zigzag strip or groove on the inclined surface of the skirt-shaped portions, and the density of the wavy shape or the zigzag shape of the convex strip or the groove marks the thickness of the color resist pattern, that is, the larger the thickness of the color resist pattern, the larger the density of the wavy shape or the zigzag shape of the convex strip or the groove in the captured image, and the smaller the thickness of the color resist pattern, the smaller the density of the wavy shape or the zigzag shape of the convex strip or the groove in the captured image.

Beneficial effects of the present application are as follows: a test key is set in the non-display area of each display panel, wherein relative positions of metal traces, widths of color resist blocks, and shifting/overlapping degree of the color resist blocks relative to the correspondingly adjacent ones of the metal patterns in the test key is used to monitor the widths of color resist blocks, and shifting/overlapping degree of the color resist blocks relative to the adjacent ones of the metal traces in a display area of the display panel, such that the failure to monitor can be avoided when the main monitoring mark fails, improving the monitoring accuracy of each display panel.

Embodiment 2

Referring to FIG. 4, based on the above embodiment, in one embodiment and implementation, the plurality of color resist patterns include a plurality of first color resist patterns 11, the plurality of metal patterns include a plurality of first metal patterns 111, and the test key includes a first test key 6, wherein the first test key 6 includes a plurality of first color resist patterns 11 and the plurality of first metal patterns 111 arranged in a first direction, and each of the first color resist patterns 11 is disposed correspondingly between adjacent ones of the first metal patterns 111.

Specifically, the plurality of first color resist patterns 11 include: a red color resist pattern, a green color resist pattern, and a blue color resist pattern; the plurality of first metal patterns include: the first metal patterns 111 disposed adjacent to opposite sides of the red color resist pattern in the first direction, the first metal patterns 111 disposed adjacent to opposite sides of the green color resist pattern in the first direction, and the first metal patterns 111 disposed adjacent to opposite sides of the blue color resist pattern in the first direction. The first metal patterns 111 adjacent to opposite sides of each of the first color resist patterns 11 are used to measure their relative positions in the first direction, each of the first color resist patterns 11 is used to measure its width in the first direction, and each of the first color resist patterns 11 and the first metal patterns 111 adjacent to opposite sides of the first color resist patterns 11 are used to measure shifting/overlapping degree in the first direction of each of the first color resist patterns 11 and the first metal patterns 111 adjacent to opposite sides of the first color resist patterns 11. Specifically, the first metal patterns 111 adjacent to opposite sides of the red color resist pattern are used to measure their relative positions in the second direction, the red color resist pattern is used to measure its width in the second direction, and the red color resist pattern and the first metal patterns 111 adjacent to the opposite sides of the red color resist pattern are used to measure the shifting/overlapping degree in the second direction of the red color resist pattern and the first metal patterns 111 on opposite sides of the red color resist pattern; the first metal patterns 111 adjacent to opposite sides of the green color resist pattern are used to measure their relative positions in the second direction, the green color resist pattern is used to measure its width in the second direction, and the green color resist pattern and the first metal patterns 111 adjacent to opposite sides of the green color resist pattern are used to measure the shifting/overlapping degree in the second direction of the green color resist pattern and the first metal patterns 111 adjacent to opposite sides of the green color resist pattern; the first metal patterns 111 adjacent to opposite sides of the blue color resist pattern are used to measure their relative positions in the second direction, the blue color resist pattern is used to measure its width in the second direction, and the blue color resist pattern and the first metal patterns 111 adjacent to opposite sides of the blue color resist pattern are used to measure the shifting/overlapping degree in the second direction of the blue color resist pattern and the first metal patterns 111 adjacent to opposite sides of the blue color resist pattern.

In FIG. 4, in order to compress the space occupied by the plurality of first color resist patterns and the plurality of first metal patterns in the panel, adjacent ones of the first color resist patterns 11 may selectively share one of the first metal patterns 111, which is not particularly limited herein.

In FIG. 4, taking the blue color resist pattern provided with a notch 101 as an example, the notch 101 functions to facilitate the process tool to catch the position of the test key, and devices or systems such as computers, software, and the like can recognize the position of the blue color resist pattern through the notch 101, thereby using this to distinguish the positions of the red color resist pattern and the green color resist pattern. The position of the notch 101 is not particularly limited herein, and the notch 101 can be set on each of the metal patterns or/and any one or more of the color resist patterns in the test key.

It should be noted that, in the first test key 6 shown in FIG. 4, although in this preferred embodiment, each of the first color resist patterns 11 is not in contact with adjacent ones of the first metal patterns 111 corresponding thereto in the first direction, but it does not particularly limited whether each of the first color resist patterns 11 in the preset design or produced pattern is in contact or not with adjacent ones of the first metal patterns 111 corresponding thereto in the first direction, and only the preferred embodiments or situations are illustrated here. As shown in FIG. 4, in the first test key 6, in a preferred embodiment or implementation, the red color resist pattern is spaced apart from adjacent ones of the first metal patterns 111 corresponding thereto by a distance r1 and a distance r2, respectively; the green color resist pattern is spaced apart from adjacent ones of the first metal patterns 111 corresponding thereto by a distance g1 and a distance g2, respectively; and the blue color resist pattern is spaced apart from adjacent ones of the first metal patterns 111 corresponding thereto by a distance b1 and a distance b2, respectively. The widths of the red color resist pattern, the green color resist pattern, and the blue color resist pattern in the first direction are represented by r3, g3, and b3, respectively.

By calculating a difference between a measured value and a preset value, the relative positions of the plurality of metal patterns in the test key, the widths of the plurality of color resist patterns, and the shifting/overlapping degree of the plurality of color resist patterns relative to adjacent ones of the metal patterns corresponding thereto can be calculated. For example, in the first test key 6 shown in FIG. 4, the overlapping degree between the red color resist pattern 11 and the first metal patterns 111 can be represented by the measured r1 minus preset r1.

Specifically, the measurement and use method S of the first test key is described here by taking the red color resist pattern and adjacent ones of the first metal patterns corresponding thereto as an example. The method S includes the following steps:

S1: Taking a photo of the first test key 6.

S2: Comparing the photo of the first test key 6 with a design pattern or a preset pattern through an equipment or system such as a computer, software, and so on.

S3: Determining whether the relative positions of the adjacent ones of the first metal patterns corresponding to the red color resist pattern are within ranges of the preset design value and error value or not, wherein the relative positions include the respective widths of and distance between the adjacent ones of the first metal patterns corresponding to the red color resist pattern. It should be noted that the relative positions of the adjacent ones of the first metal patterns 111 is used as a reference degree/standard degree for subsequent measurement and calculation, and generally, there are also a lot of monitoring marks or test keys disposed at other positions on the display panel or other positions on the mother board for monitoring the width and distance of metals in a layer same as the first metal pattern. Generally, when the relative positions of a plurality of first metal patterns 111 are within ranges of the preset design value and error value, the subsequent production will continue, and the subsequent measurement will have practical production reference significance.

S4: Obtaining a width of the red color resist pattern in the first direction through the step S2 or repeating the step S2, wherein a measured r3 minus a preset r3 can be used to represent the difference between an implementation width and a preset width of the red color resist pattern as a reference for actual production;

S5: Obtaining shifting/overlapping degree in the first direction of the red color resist pattern and adjacent ones of the first metal patterns 111 corresponding thereto through the step S2 or repeating the step S2. Referring to FIG. 1 (b), the display area of each display panel 2 is provided with a plurality of color resist blocks 601. The color resist blocks 601 include a red color resist block, a green color resist block, and a blue color resist block. Adjacent metal traces 501 (such as column driving lines) are arranged between the red color resist block, the green color resist block, and the blue color resist block, and edges of the red color resist block, the green color resist block, the blue color resist block, and the adjacent metal traces 5011 are aligned with the preset design. In this case, preset overlapping of the red color resist block and the column driving line 501 is 0, and the values of measured r1 and measured r2 are obtained by repeating step S2, wherein measured r1 minus preset r1 can represent the overlapping degree of the red color resist layer and column driving line 501 adjacent to right of the red color resist layer, measured r2 minus preset r2 can represent the shifting degree of the red color resist layer and column driving line 502 adjacent to left of the red color resist layer. The shifting degree of the red color resist layer relative to the column driving lines 501 adjacent to opposite sides of the red color resist layer is: measured r1 minus preset r1 plus (measured r3 minus preset r3)/2, or measured r2 minus preset r2 plus (measured r3 minus preset r3)/2. When the color resist layer and the metal traces in the display area have different preset design overlapping degrees, the shifting/overlapping degree may be also obtained correspondingly by different calculation methods.

The order of steps S4 and S5 in method S can be adjusted without limitation.

It should be noted that in an embodiment of the present application, in the first test key, the relative positions of adjacent ones of the first metal patterns corresponding to each of the first color resist patterns, the width of each of the first color resist patterns, and the shifting/overlapping degree in the first direction between the first color resist pattern and adjacent ones of the first metal patterns corresponding thereto can be measured and calculated by the method S, and details are not described here for brevity.

In FIG. 4, although a plurality of metal patterns and a plurality of color resist patterns in the test key are illustrated as rectangles, in actual panel production, the plurality of metal patterns and the plurality of color resist patterns in the test key may be set to have other shapes, such as a curve shape, a circular shape, etc. and are not particularly limited herein.

In an embodiment of the present application, a test key suitable for setting in each display panel is provided, wherein the test key includes a first test key, which can monitor the relative positions of each of the metal patterns, the width of each of the color resist patterns, and the shifting/overlapping degree between each of the color resist patterns and its corresponding metal patterns when the main monitoring mark fails, thereby improving the monitoring accuracy of each display panel.

In an embodiment of the present application, the test key is provided in each display panel, and the test key includes a first test key. By taking the first test key as an example for illustration, the steps and principles of detecting the relative positions of adjacent ones of the first metal patterns, the width of each of the color resist patterns, and the shifting/overlapping degree between each of the color resist patterns and adjacent ones of the first metal patterns corresponding thereto through the method S are described. The width of the color resist block and the shifting/overlapping degree of the color resist block relative to the metal traces in the display area of the display panel can be monitored by testing the relative positions of the metal patterns, the widths of the color resist patterns, and the shifting/overlapping degree of the color resist pattern relative to the corresponding metal patterns, such that the failure to monitor is avoided when the main monitor mark fails, and the monitoring accuracy of each display panel is improved.

Embodiment 3

Figure 5:
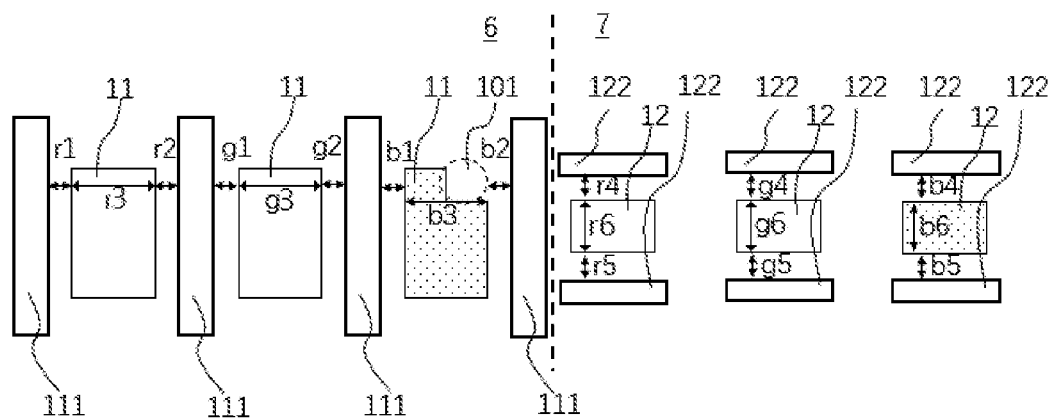
FIG. 5 is a schematic structural diagram of a test key of a display panel according to Embodiment 3 of the present application.

Referring to FIG. 5, this embodiment is substantially the same as or similar to Embodiments 1 and 2, the difference is that the plurality of color resist patterns further include a plurality of second color resist patterns 12, the plurality of metal patterns further include a plurality of second metal patterns 122, the test key further includes a second test key 7, the second test key 7 is located at a side of the first test key 6 in the first direction, and the second test key 7 includes a plurality of second color resist patterns 12 and a plurality of second metal patterns 122 arranged in the second direction, each of the second color resist patterns 12 is disposed correspondingly between adjacent ones of the second metal patterns 122, and the second direction is perpendicular to the first direction.

Specifically, the test key includes both a first test key 6 and a second test key, and the plurality of second color resist patterns 12 include: a red color resist pattern, a green color resist pattern, and a blue color resist pattern; the plurality of second metal patterns 112 include: the first metal patterns 122 disposed adjacent to opposite sides of the green color resist pattern in the first direction, the second metal patterns 122 disposed adjacent to opposite sides of the red color resist pattern in the first direction, and the second metal patterns 122 disposed adjacent to opposite sides of the blue color resist pattern in the first direction. The second metal patterns 122 adjacent to opposite sides of each of the second color resist patterns 12 are used to measure their relative positions in the second direction, each of the second color resist patterns 122 is used to measure its width in the second direction, and each of the second color resist patterns 12 and the second metal patterns 122 adjacent to opposite sides of the second color resist patterns 12 are used to measure shifting/overlapping degree in the second direction of each of the second color resist patterns 12 and the second metal patterns 122 adjacent to opposite sides of the second color resist patterns 12. Specifically, the second metal patterns 122 adjacent to opposite sides of the red color resist pattern are used to measure their relative positions in the second direction, the red color resist pattern is used to measure its width in the second direction, and the red color resist pattern and the second metal patterns 122 adjacent to the opposite sides of the red color resist pattern are used to measure the shifting/overlapping degree in the second direction of the red color resist pattern and the second metal patterns 122 on opposite sides of the red color resist pattern; the second metal patterns 122 adjacent to opposite sides of the green color resist pattern are used to measure their relative positions in the second direction, the green color resist pattern is used to measure its width in the second direction, and the green color resist pattern and the second metal patterns 122 adjacent to opposite sides of the green color resist pattern are used to measure the shifting/overlapping degree in the second direction of the green color resist pattern and the second metal patterns 122 adjacent to opposite sides of the green color resist pattern; the second metal patterns 122 adjacent to opposite sides of the blue color resist pattern are used to measure their relative positions in the second direction, the blue color resist pattern is used to measure its width in the second direction, and the blue color resist pattern and the second metal patterns 122 adjacent to opposite sides of the blue color resist pattern are used to measure the shifting/overlapping degree in the second direction of the blue color resist pattern and the second metal patterns 122 adjacent to opposite sides of the blue color resist pattern.

It should be noted that, in the second test key 7 shown in FIG. 5, although in this preferred embodiment, each of the first color resist patterns 11 is not in contact with adjacent ones of the second metal patterns 122 corresponding thereto in the second direction, but it does not particularly limited whether each of the second color resist patterns 12 in preset design or produced pattern is in contact or not with adjacent ones of the second metal patterns 122 corresponding thereto in the second direction, and only the preferred embodiments or situations are illustrated here. As shown in FIG. 5, in the second test key 7, in a preferred embodiment or implementation, the red color resist pattern is spaced apart from adjacent ones of the second metal patterns 122 corresponding thereto by a distance r4 and a distance r5, respectively; the green color resist pattern is spaced apart from adjacent ones of the second metal patterns 122 corresponding thereto by a distance g4 and a distance g5, respectively; and the blue color resist pattern is spaced apart from adjacent ones of the second metal patterns 122 corresponding thereto by a distance b4 and a distance b5, respectively. The widths of the red color resist pattern, the green color resist pattern, and the blue color resist pattern in the second direction are represented by r6, g6, and b6, respectively.

It should be noted that the first direction may be an x direction and the second direction may be a y direction, or the first direction may be the y direction and the second direction may be the x direction, and the first direction and the second direction are not particularly limited herein, wherein the second direction is perpendicular to the first direction.

It should be noted that, in the embodiment of the present application, the test key includes both the first test key 6 and the second test key 7.

In the first test key, the relative positions of adjacent ones of the first metal patterns corresponding to each of the first color resist patterns, the width of each of the first color resist patterns, and the shifting/overlapping degree in the first direction between the first color resist pattern and adjacent ones of the first metal patterns corresponding thereto can be measured and calculated by the method S. Meanwhile, in the second test key, the relative positions of adjacent ones of the second metal patterns corresponding to each of the second color resist patterns, the width of each of the second color resist patterns, and the shifting/overlapping degree in the second direction between the second color resist pattern and adjacent ones of the second metal patterns corresponding thereto can also be measured and calculated by the method S.

Figure 6:
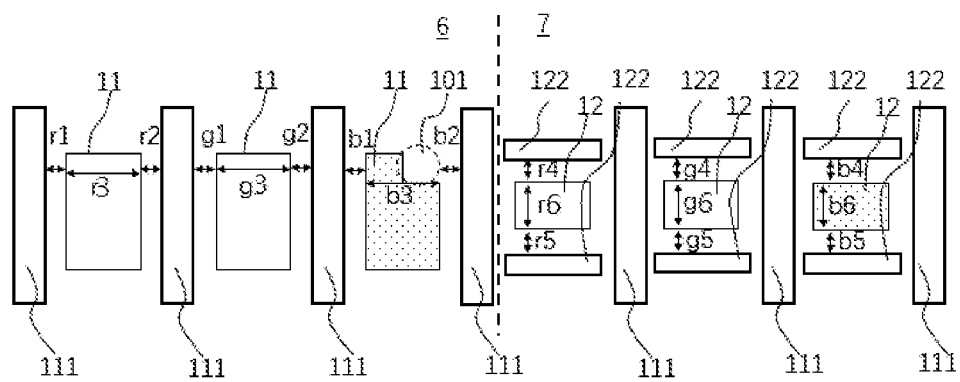
FIG. 6 is a schematic structural diagram of a test key of a display panel according to Embodiment 3 of the present application.

Referring to FIG. 6. In some preferred embodiments or implementation, the second test key 7 further includes first metal patterns 111, and each of the second color resist patterns 12 and adjacent ones of the second metal patterns 122 corresponding thereto are located correspondingly between adjacent ones of the first metal patterns 111.

Referring to FIG. 5 and FIG. 6, the present application includes but is not particularly limited to a preferred embodiment, in which, the plurality of first color resist patterns 11 and a plurality of second color resist patterns 12 are arranged in the first direction, and a plurality of first color resist patterns 11 include a red resist pattern, a green resist pattern, and a blue resist pattern arranged in the first direction, while the second color resist patterns 12 include a red color resist pattern, a green color resist pattern, and a blue color resist pattern arranged in the second direction.

In an embodiment of the present application, the test key is provided in each display panel, and the test key includes a first test key and a second key. By the first test key and the second key, relevant parameters in the first direction and the second direction can be monitored at the same time, such that the failure to monitor is avoided when the main monitoring mark fails, and the monitoring accuracy of each display panel is improved.

Embodiment 4

Figure 7:
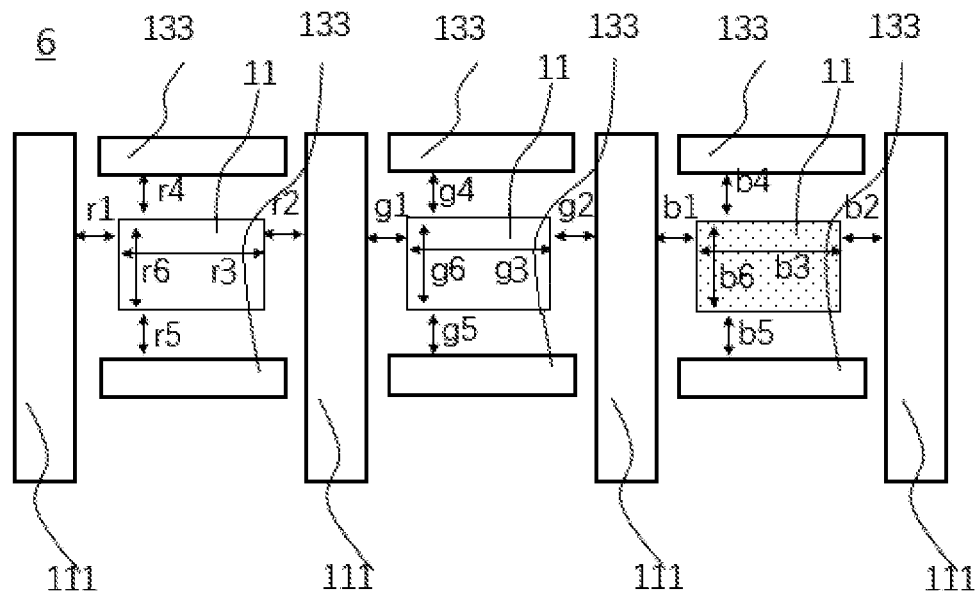
FIG. 7 is a schematic structural diagram of a test key of a display panel according to Embodiment 4 of the present application.

Referring to FIG. 7, this embodiment is substantially the same as or similar to Embodiments 1, 2, and 3, the difference is that: the plurality of metal patterns further includes a plurality of third metal patterns 133, and the first test key 6 further includes a plurality of third metal patterns 133 arranged in the second direction. Each of the first color resist patterns 11 is also disposed between adjacent ones of the third metal patterns 133, the second direction is perpendicular to the first direction, each of the third metal patterns 133 is located between adjacent ones of the first metal patterns 111 corresponding thereto or correspondingly intersects adjacent ones of the first metal patterns 111. That is, in this embodiment, the first test key 6 includes the first color resist pattern 11, the first metal patterns 11, and the third metal patterns 133 at the same time.

In this embodiment, through the method S, the first test key can simultaneously measure the parameters of the first direction and the second direction to monitor the display panel. In the first test key, the relative positions of adjacent ones of the first metal patterns corresponding to each of the first color resist patterns, the width of each of the first color resist patterns, and the shifting/overlapping degree in the first direction between the first color resist pattern and adjacent ones of the first metal patterns corresponding thereto can be measured and calculated by the method S. Meanwhile, the relative positions of adjacent ones of the third metal patterns corresponding to each of the first color resist patterns, the width of each of the first color resist patterns, and the shifting/overlapping degree in the second direction between the first color resist pattern and adjacent ones of the third metal patterns corresponding thereto can also be measured and calculated by the method S, and the details will not be repeated herein for brevity.

In an embodiment of the present application, the test key is provided in each display panel, and the first test key may be provided with a plurality of first color resist patterns, a plurality of first metal patterns, and a plurality of third metal patterns 133 at the same time. By the first test key, relevant parameters in the first direction and the second direction cam be monitored at the same time, such that the failure to monitor is avoided when the main monitoring mark fails, and the monitoring accuracy of each display panel is improved.

Embodiment 5

Figure 8:
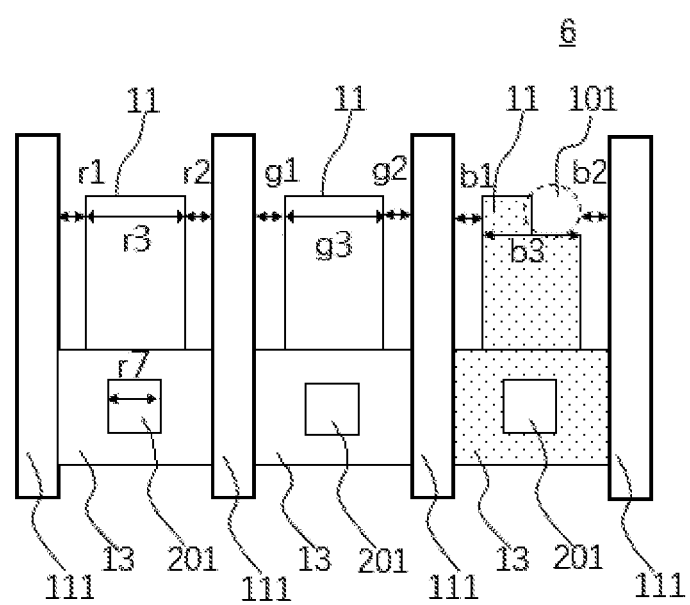
FIG. 8 is a schematic structural diagram of a test key of a display panel according to Embodiment 5 of the present application.

Referring to FIG. 8, this embodiment is substantially the same as or similar to the previous embodiments, except that the plurality of color resist patterns further includes a plurality of third color resist patterns 13, and the first test key 6 further includes a plurality of third color resist patterns 13, each of the third color resist patterns 13 is disposed on one side of the first color resist pattern 11, and at least one through hole 201 is disposed in the third color resist patterns 13.

Specifically, the third color resist pattern 13 includes: a red color resist pattern, a green color resist pattern, and a blue color resist pattern. At least one through hole 201 is provided in the red color resist pattern, at least one through hole 201 is provided in the green color resist pattern, and at least one through hole 201 is provided in the blue color resist pattern. In a pixel of the display area of the display panel, the color resist block in the pixel includes a via hole. The present application includes but is not particularly limited to a preferred embodiment, in which, in a color filter on array (COA) substrate pixel, the pixel electrode is electrically connected to a source/drain of a thin film transistor (TFT) through the via hole, and by setting the color resist pattern for measuring the size of the through hole in the test key, the size of the via hole on the color resist layer in the pixel of the display area can be well monitored. A shape of the through hole in the test key can be the same as a shape of the via hole in the pixel of the display area. The design size of the through hole in the test key can be the same as the design size of the via hole in the pixel of the display area. The shape and size of the through hole in the test key can directly explain the shape and size of the via hole on the color resist block in the pixel of the display area.

Based on the method S in the foregoing embodiments, in this embodiment, a red color resist pattern in the plurality of third color resist patterns 13 is used as an example for illustration, and the method S further includes:

S6: obtaining the size of the through hole 201 by the step S2 or repeating the step S2 again, wherein the size variation of the through hole 201 can be represented by measured r7 minus preset r7.

The order of the steps S4, S5, and S6 in the method S can be adjusted without limitation.

In an embodiment of the present application, based on the foregoing embodiments, a plurality of third color resist patterns for monitoring the size of the via hole in the pixel of the display area are introduced, which can well monitor the relative positions of each of the metal patterns, the width of each of the color resist patterns, and the shifting/overlapping degree between each of the color resist patterns and its corresponding metal patterns, as well as the shape and size of the via hole, thereby improving the monitoring accuracy of each display panel.

Embodiment 6

Figure 9:
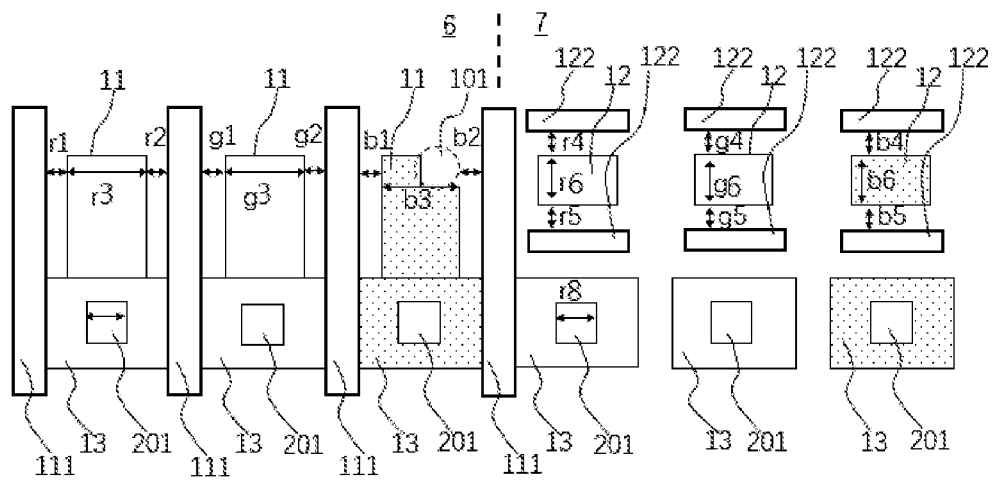
FIG. 9 is a schematic structural diagram of a test key of a display panel according to Embodiment 6 of the present application.

Referring to FIG. 9, this embodiment is substantially the same as or similar to the foregoing embodiments. This embodiment takes a preferred implementation as an example for illustration. In a preferred implementation of this embodiment, the test key includes the first test key 6 described in Embodiment 3, and the first test key 6 includes a plurality of first color resist patterns 11 and a plurality of first metal patterns 111 arranged in the first direction, each of the first color resist patterns 11 is disposed between adjacent ones of the first metal patterns 111. The test key includes the second test key 7 described in Embodiment 3, the second test key 7 is located at one side of the first test key 6 along the first direction, the second test key 7 includes a plurality of second color resist patterns 12 and a plurality of second metal patterns 122 arranged in the second direction, each of the second color resist patterns 12 is provided between adjacent ones of the second metal patterns 122 corresponding thereto, and the second direction is perpendicular to the first direction. The test key further includes a plurality of third color resist patterns 13 disposed at a side of the first color resist patterns 11 or/and the plurality of second color resist patterns 12, and each of the third color resist patterns 13 has at least one through hole 201 located therein.

In a preferred embodiment, the plurality of first color resist patterns 11 and the plurality of second color resist patterns 12 are arranged in the first direction, and the plurality of first color resist patterns 11 include a red color resist pattern, a green color resist pattern, and a blue color resist pattern. In the plurality of first color resist patterns 11, the red color resist pattern, the green color resist pattern, and the blue color resist pattern are arranged in the first direction, and the plurality of second color resist patterns 12 include the red color resist pattern, the green color resist pattern, and the blue color resist pattern arranged in the first direction.

Figure 10:
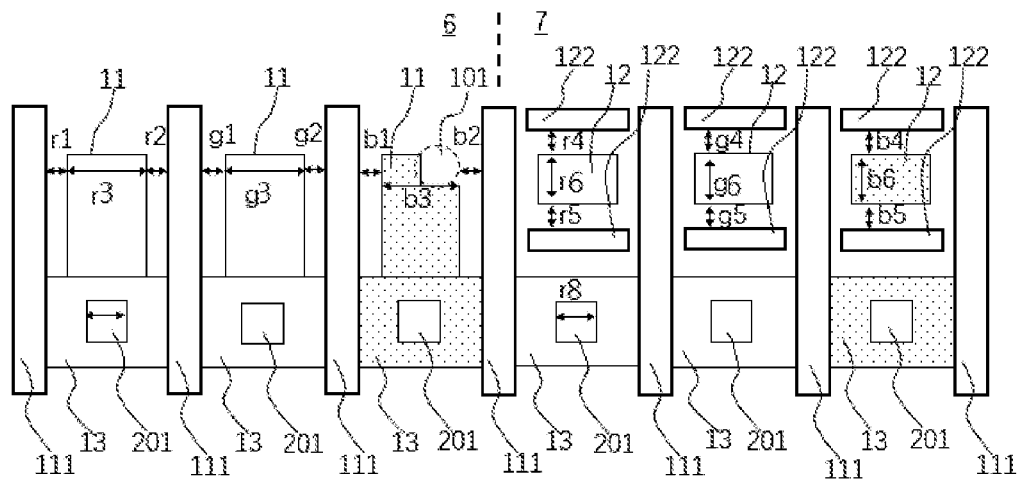
FIG. 10 is a schematic structural diagram of a test key of a display panel according to Embodiment 6 of the present application.

Referring to FIG. 10, in a preferred embodiment, the second test key 7 may also optionally include first metal patterns 111, and each of the second color resist patterns 12 and adjacent ones of the second metal patterns 122 corresponding thereto are located correspondingly between adjacent ones of the first metal patterns 111.

In an embodiment of the present application, based on the foregoing embodiments, a preferred implementation is exemplified, which can well monitor the relative positions of each of the metal patterns, the width of each of the color resist patterns, and the shifting/overlapping degree between each of the color resist patterns and its corresponding metal patterns, as well as the shape and size of the via hole, thereby improving the monitoring accuracy of each display panel.

Embodiment 7

Figure 11:
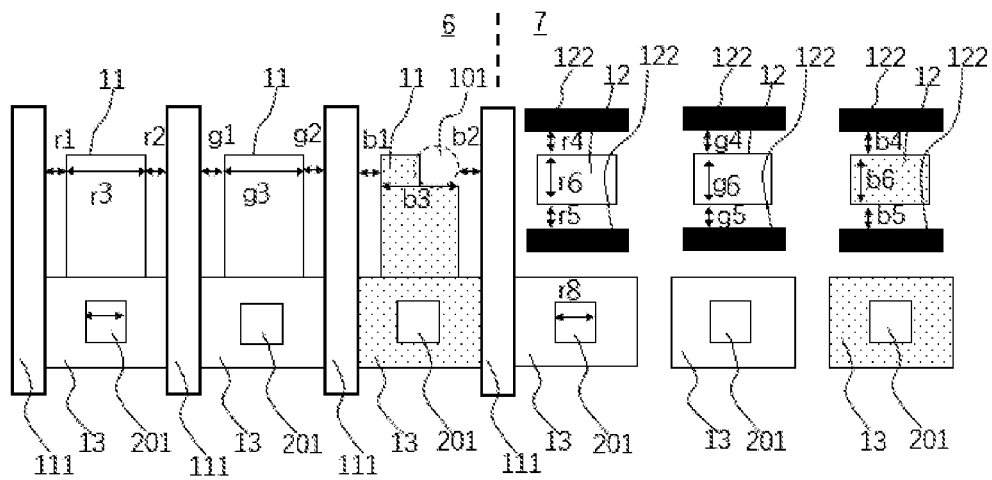
FIG. 11 is a schematic structural diagram of a test key of a display panel according to Embodiment 7 of the present application.

Referring to FIG. 11, this embodiment is substantially the same as or similar to the previous embodiments, the difference is that the first metal patterns 111 and the second metal patterns 122 are made of metals in different layers. For example, the first metal patterns 111 and the column driving lines in the display panel are disposed in a same layer, the second metal patterns 122 and the row driving lines in the display panel are disposed in a same layer. Alternatively, for example, the first metal patterns 111 and the row driving lines in the display panel are disposed in a same layer, and the second metal patterns 122 and the column driving lines in the display panel are disposed in a same layer. Further, alternatively, referring to FIG. 5, the first metal patterns 111 and the second metal patterns 122 are made of metals in a same layer. For example, the first metal patterns 111 and the second metal patterns 122 are disposed in a layer same as the column driving line or the row driving line in the display panel, which is not particularly limited herein.

In an embodiment of the present application, the first metal patterns and the second metal patterns made of metals in different layers or in a same layer have been described, and the first test key and the second test key can be set in an appropriate metal layer selected according to the specific conditions of the display panel, to facilitate the layout and manufacturing of test keys in the display panel.

Embodiment 8

Referring to FIG. 12(a), based on the foregoing embodiments, this embodiment describes the position of the test key in the display panel. A non-display area 9 includes a first border area 91 and a third border area 93 arranged opposite to each other, and a second border area 92 and a fourth border area 94 arranged opposite to each other. Any adjacent ones of the first, second, third and fourth border areas intersect each other to form a corner, and the test key is arranged on at least one of the corner, and at least one of the corner is provided with the test key in the previous embodiments.

Figure 12:
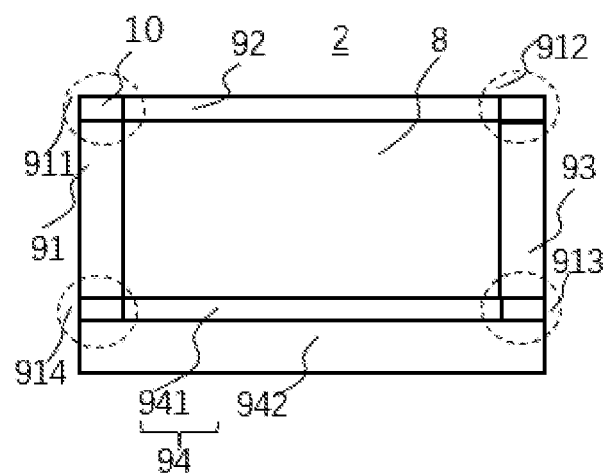
FIG. 12(*a*) is a schematic structural diagram of a test key of a display panel according to Embodiment 8 of the present application.
Figure 12:
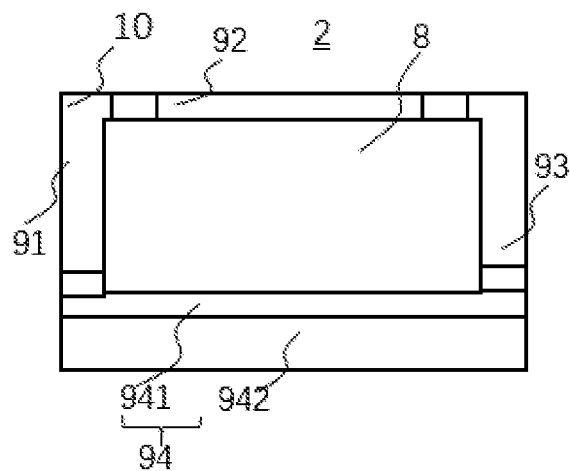
Figure 12:
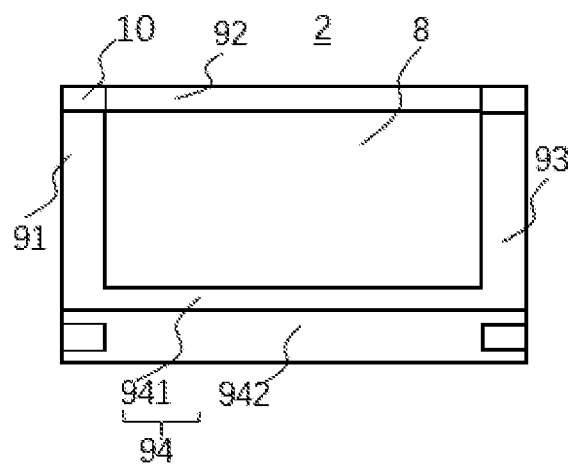
Figure 12:
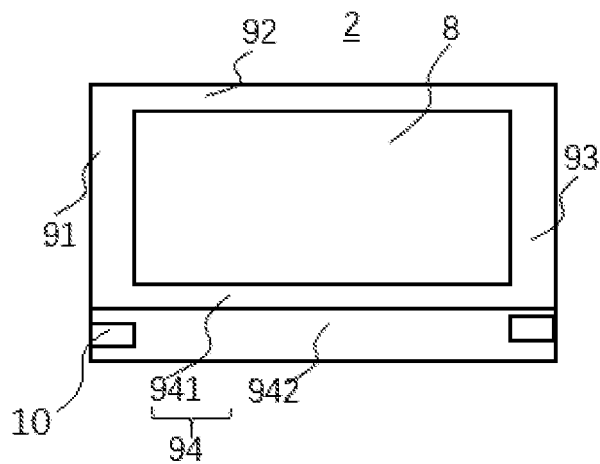

Referring to FIGS. 12(*a*), 12(*b*), 12(*c*), and 12(*d*), the first border area 91 and the second border area 92 intersect each other to form the first corner 911, the second border area 92 and the third border area 93 intersect each other to form a second corner 912, the third border area 93 and the fourth border area 94 intersect each other to form a third corner 913, and the fourth border area 94 and the first border area 91 intersect each other to form a fourth corner 914, wherein at least one of the first, second, third, and fourth corners is provided with the above-described test key.

In FIG. 12(*a*), in a preferred embodiment and implementation, at least one of the first, second, third, and fourth corners 911 to 914 is provided with a test key.

In FIG. 12(*b*), in a preferred embodiment and implementation, at least one of the first, second, third, and fourth border areas 91 to 94 is provided with a test key.

In FIG. 12(*c*), in a preferred embodiment and implementation, at least one of the first, second, third, and fourth border areas 91 to 94 is provided with a test key, wherein the fourth border area includes a fourth border first sub-area 941 provided with a frame glue structure and a fourth border second sub-area 942 provided with a pad structure, and the test key may also be disposed in the fourth border second sub-area 942. When the test key is disposed in the fourth border second sub-area 942, after the display panel is cut into small pieces from the mother board, the test key can be easily tested.

In FIG. 9(*d*), in a preferred embodiment and implementation, the test key may be selectively provided only in the fourth border second sub-area 942.

In FIGS. 12(*a*) and 12(*b*), the test key is preferably located closely adjacent to the display area. Considering the uniformity of the pattern layer formation, the shapes and sizes of a plurality of color resist patterns and a plurality of metal patterns in the test key can be better kept consistent with the display area, so as to accurately monitor the pattern layer in the display area through the second test key.

In an embodiment of the present application, a display panel including a test key is provided, and a detailed description on the position of the test key in the display panel is preferably illustrated, in order to reduce the area occupied by the test key in the display panel and improve the monitoring accuracy of the pattern layer in Embodiment 9

Figure 13:
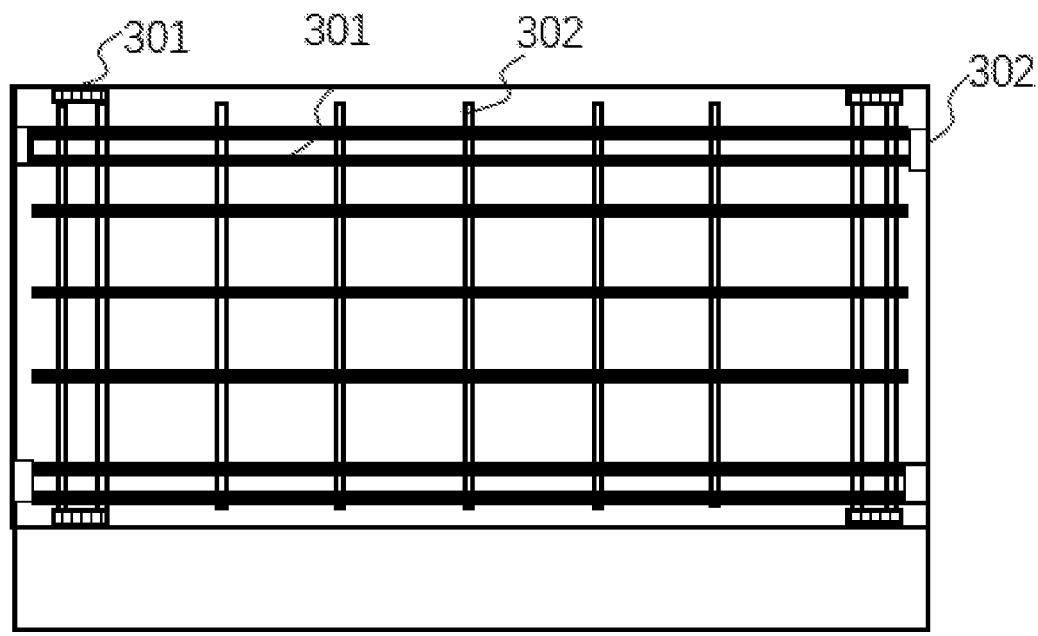
FIG. 13 is a schematic structural diagram of a test key of a display panel according to Embodiment 9 of the present application.
Figure 14:
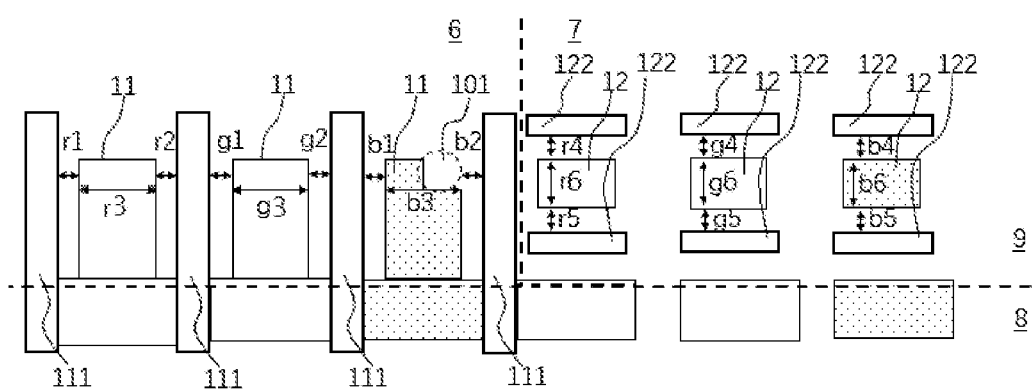
FIG. 14 is a schematic structural diagram of a test key of a display panel according to Embodiment 9 of the present application.
Figure 15:
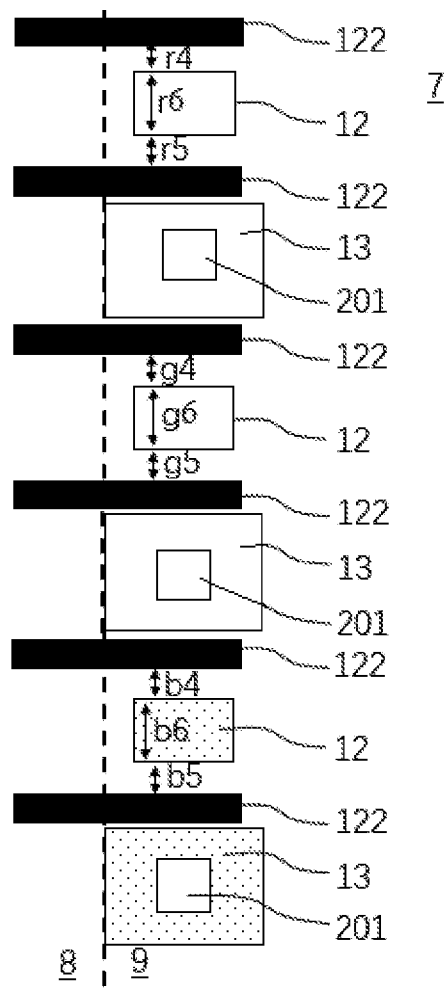
FIG. 15 is a schematic structural diagram of a test key of a display panel according to Embodiment 9 of the present application.

Referring to FIG. 13, FIG. 14, and FIG. 15, based on the foregoing embodiments, this embodiment further exemplifies the setting of the test key in the display panel. Part or all of the metal patterns are formed by the metal traces extending to the non-display area; or/and part or all of the color resist patterns are formed by the color resist blocks extending to the non-display area. The metal patterns include one or more of the plurality of first metal patterns, the plurality of second metal patterns, and the plurality of third metal patterns. The plurality of color resist patterns include one or more of the plurality of first color resist patterns, the plurality of the two-color resist patterns, and the plurality of third color resist patterns, which are not particularly limited herein.

In FIG. 13, the display area of the display panel includes row driving lines (such as scan lines) 301 and column driving lines (such as data lines) 302. Some of the column driving lines 302 are arranged in the first direction and extend in the second directions, and some of the row driving lines 301 are arranged in the second direction and extend in the first direction. A color resist layer is further provided in the display area of the display panel. A color filter on array (COA) display panel is taken as an example for illustration. In the display panel using the COA technology, color resist blocks are formed on a thin film transistor array substrate. The color resist blocks include a red color resist block, a green color resist block, and a blue color resist block. Optionally, for example, the column driving lines 302 or/and row driving lines 301 in the display area extend from the display area to the non-display area to form the first metal patterns in the first test key or/and the second metal patterns in the second test key, and the red color resist block, the green color resist block, and the blue color resist block in the display area extend to the non-display area to form the first color resist patterns in the first test key or/and the second color resist patterns in the second test key.

Referring to FIGS. 13 and 14, in a preferred embodiment and implementation, the display panel includes a display area 8 and a non-display area 9, and the test key is provided at a portion of the non-display area 9 adjacent to the display area 8. The plurality of first metal patterns 111 are arranged on opposite sides of the plurality of first color resist patterns 11 in the first direction and extend in the second direction. The plurality of column driving lines 302 in the display area 8 extend in the second direction. The red color resist block, the green color resist block, and the blue color resist blocks in the display area 8 are arranged in the first direction and extend in the second direction. The plurality of first metal patterns 111 of the first test key 6 are formed by the plurality of column driving lines 302 of the display area extending to the non-display area 9, and the plurality of first color resist patterns 11 are formed by the red color resist block, the green color resist block, and the blue color resist block in the display area extending to the non-display area 9, such that the area occupied by the test key in the display panel is reduced. The plurality of first metal patterns 111 and a plurality of first color resist patterns 11 in the first test key 6 are formed by the plurality of column driving lines 302 and the plurality of color resist blocks in the display area 8 extending to the non-display area 9, so that the shapes and the sizes of the plurality of color resist patterns and the plurality of metal patterns in the first test key 6 can be better kept consistent with the display area, so as to accurately monitor the pattern layer in the display area 8 through the first test key 6.

Referring to FIGS. 13 and 15, in some implementations, the display panel includes a display area 8 and a non-display area 9. The test key is provided at a portion of the non-display area 9 adjacent to the display area 8. The metal patterns 122 are arranged on opposite sides of the plurality of second color resist patterns 12 in the second direction and extend in the first direction, and the plurality of row driving lines 301 of the display area 8 extend in the first direction. The plurality of second metal patterns 122 of the second test key 7 are formed by applying a plurality of row driving lines 301 of the display area to the non-display area, which reduces the area occupied by the test key in the display panel. A plurality of second metal patterns 122 in the second test key 6 are formed by a plurality of row driving lines 301 within the display area 8 extending to the non-display area 9, so that the shape and size of the plurality of metal patterns in the second test key 7 can be better kept the same with the display area, so as to accurately monitor the pattern layer in the display area 8 through the second test key 7.

It should be noted that when the test key is provided at a portion of the non-display area 9 adjacent to the display area 8, the first test key 7 and the second test key 8 may be provided in one portion, or may be provided separately at different portions. Part of or all of the plurality of metal patterns and the plurality of color resist patterns in the first test key 7 or/and the second test key 8 may be formed by extending the plurality of column driving lines and the plurality of color resist layers in the display area 9 to the non-display area.

In an embodiment of the present application, a display panel including a test key is provided, and setting forms of the first test key and the second test key in the display panel in a preferred embodiment are detailed and exemplified. In the test keys, part or all of the plurality of metal patterns and the plurality of color resist patterns may be formed by metal traces and color resist layers in the display area extending to the non-display area, to further reduce the area occupied by the first test key and the second test key in the display panel, thereby improving the monitoring accuracy of the pattern layer in the display area by the test key.

Although in the embodiments of the present application, a color filter on array (COA) display panel is used as an example for illustration, it is not particularly limited thereto. For example, the display panel may be a non-COA type, and the color resist layer is provided on a color filter (CF) substrate, which may set test keys by the same or similar solutions as the embodiments of the present application, to monitor the display area.

Although in the embodiments of the present application, the method S is used to explain how to monitor the display panel, the test key can also be measured by other methods to realize the monitoring of the display panel.

The present application also proposes an electronic device including the above display panel.

The embodiments of the present application are described in detail above, and specific examples are used in this document to explain the principles and implementation of the present invention. The descriptions of the above embodiments are only for understanding the method of the present invention and its core ideas, to help understand the technical solution of the present application and its core ideas, and a person of ordinary skill in the art should understand that it can still modify the technical solution described in the foregoing embodiments, or equivalently replace some of the technical features. Such modifications or replacements do not depart the spirit of the corresponding technical solutions beyond the scope of the technical solutions of the embodiments of the present application.

What is claimed is:

1. A display panel, comprising a display area and a non-display area surrounding the display area, wherein the display panel comprises:
   a plurality of metal traces and a plurality of color resist blocks located in the display area; and
   a test key located in the non-display area, wherein the test key comprises a plurality of color resist patterns and a plurality of metal patterns, each of the color resist patterns corresponds to one of the color resist blocks of a color same as its corresponding one of the color resist patterns, each of the metal patterns corresponds to one of the metal traces, and each of the color resist patterns is disposed correspondingly between adjacent ones of the metal patterns,
   wherein the plurality of color resist patterns comprise a plurality of first color resist patterns, the plurality of metal patterns comprise a plurality of first metal patterns arranged in a first direction, and each of the first color resist patterns is disposed correspondingly between adjacent ones of the first metal patterns; and
   wherein the plurality of color resist patterns further comprise a plurality of second color resist patterns, the plurality of metal patterns further comprise a plurality of second metal patterns arranged in a second direction, the second color resist patterns and the second metal patterns are located at a side of the first color resist patterns and the first metal patterns in the first direction, each of the second color resist patterns is disposed correspondingly between adjacent ones of the second metal patterns, and the second direction is perpendicular to the first direction.

2. The display panel according to claim 1, wherein the plurality of first color resist patterns and the plurality of second color resist patterns are all arranged in the first direction.

3. The display panel according to claim 1, wherein each of the second color resist patterns and adjacent ones of the second metal patterns corresponding thereto are located correspondingly between adjacent ones of the first metal patterns.

4. The display panel according to claim 1, wherein the plurality of metal patterns further comprise a plurality of third metal patterns arranged in a second direction, each of the first color resist patterns is further disposed correspondingly between adjacent ones of the third metal patterns, the second direction is perpendicular to the first direction, and each of the third metal patterns is located correspondingly between adjacent ones of the first metal patterns, or each of the third metal patterns correspondingly intersects adjacent ones of the first metal patterns.

5. The display panel according to claim 1, wherein the plurality of color resist patterns further comprise a plurality of third color resist patterns, each of the third color resist patterns is disposed on one side of the first color resist patterns, and the third color resist patterns are provided with at least one through hole.

6. The display panel according to claim 1, wherein the first metal patterns and the second metal patterns are composed of metals in a same layer or metals in different layers.

7. The display panel according to claim 1, wherein the non-display area comprises a first border area and a third border area arranged opposite to each other, and a second border area and a fourth border area arranged opposite to each other, any adjacent ones of the first, second, third and fourth border areas intersect each other to form a corner, and the test key is arranged on at least one of the corner.

8. The display panel according to claim 1, wherein the non-display area comprises a first border area and a third border area arranged opposite to each other, and a second border area and a fourth border area arranged opposite to each other, any adjacent ones of the first, second, third and fourth border areas intersect each other to form a corner, and the test key is arranged on at least one of the corner.

9. The display panel according to claim 1, wherein
the non-display area comprises a first border area and a third border area arranged opposite to each other, and a second border area and a fourth border area arranged opposite to each other, any adjacent ones of the first, second, third and fourth border areas intersect each other to form a corner, and the test key is arranged on at least one of the corner.

10. The display panel according to claim 4, wherein
the non-display area comprises a first border area and a third border area arranged opposite to each other, and a second border area and a fourth border area arranged opposite to each other, any adjacent ones of the first, second, third and fourth border areas intersect each other to form a corner, and the test key is arranged on at least one of the corner.

11. The display panel according to claim 5, wherein
the non-display area comprises a first border area and a third border area arranged opposite to each other, and a second border area and a fourth border area arranged opposite to each other, any adjacent ones of the first, second, third and fourth border areas intersect each other to form a corner, and the test key is arranged on at least one of the corner.

12. The display panel according to claim 1, wherein
part or all of the metal patterns are formed by the metal traces extending to the non-display area; or/and
part or all of the color resist patterns are formed by the color resist blocks extending to the non-display area.

13. An electronic device, comprising a display panel, the display panel comprising a display area and a non-display area surrounding the display area, wherein the display panel comprises:
a plurality of metal traces and a plurality of color resist blocks located in the display area; and
a test key located in the non-display area, wherein the test key comprises a plurality of color resist patterns and a plurality of metal patterns, each of the color resist patterns corresponds to one of the color resist blocks of a color same as its corresponding one of the color resist patterns, each of the metal patterns corresponds to one of the metal traces, and each of the color resist patterns is disposed correspondingly between adjacent ones of the metal patterns,
wherein the plurality of color resist patterns comprise a plurality of first color resist patterns, the plurality of metal patterns comprise a plurality of first metal patterns arranged in a first direction, and each of the first color resist patterns is disposed correspondingly between adjacent ones of the first metal patterns; and
wherein the plurality of color resist patterns further comprise a plurality of second color resist patterns, the plurality of metal patterns further comprise a plurality of second metal patterns arranged in a second direction, the second color resist patterns and the second metal patterns are located at a side of the first color resist patterns and the first metal patterns in the first direction, each of the second color resist patterns is disposed correspondingly between adjacent ones of the second metal patterns, and the second direction is perpendicular to the first direction.

14. The electronic device according to claim 13, wherein
the plurality of metal patterns further comprise a plurality of third metal patterns arranged in a second direction, each of the first color resist patterns is further disposed correspondingly between adjacent ones of the third metal patterns, the second direction is perpendicular to the first direction, and each of the third metal patterns is located correspondingly between adjacent ones of the first metal patterns, or each of the third metal patterns correspondingly intersects adjacent ones of the first metal patterns.

15. The electronic device according to claim 13, wherein
the plurality of color resist patterns further comprise a plurality of third color resist patterns, each of the third color resist patterns is disposed on one side of the first color resist patterns, and the third color resist patterns are provided with at least one through hole.

16. The electronic device according to claim 13, wherein
part or all of the metal patterns are formed by the metal traces extending to the non-display area; or/and
part or all of the color resist patterns are formed by the color resist blocks extending to the non-display area.

\* \* \* \* \*